(12) United States Patent
Katsui et al.

(10) Patent No.: US 12,336,406 B2
(45) Date of Patent: Jun. 17, 2025

(54) DISPLAY

(71) Applicants: JSR CORPORATION, Tokyo (JP); Mattrix Technologies, Inc, Gainesville, FL (US)

(72) Inventors: Hiromitsu Katsui, Minato-ku (JP); Bo Liu, Gainesville, FL (US); Maxime Lemaitre, Gainesville, FL (US)

(73) Assignees: JSR CORPORATION, Tokyo (JP); MATTRIX TECHNOLOGIES, INC., Gainesville, FL (US)

( * ) Notice: Subject to any disclaimer, the term of this patent is extended or adjusted under 35 U.S.C. 154(b) by 270 days.

(21) Appl. No.: 17/797,352

(22) PCT Filed: Feb. 2, 2021

(86) PCT No.: PCT/JP2021/003656
§ 371 (c)(1),
(2) Date: Aug. 3, 2022

(87) PCT Pub. No.: WO2021/157550
PCT Pub. Date: Aug. 12, 2021

(65) Prior Publication Data
US 2023/0058493 A1 Feb. 23, 2023

Related U.S. Application Data

(60) Provisional application No. 63/142,143, filed on Jan. 27, 2021.

(30) Foreign Application Priority Data

Feb. 7, 2020 (JP) .................................. 2020-019527
Jan. 12, 2021 (JP) .................................. 2021-002734

(51) Int. Cl.
*H10K 59/131* (2023.01)
*H10K 50/30* (2023.01)
*H10K 59/125* (2023.01)

(52) U.S. Cl.
CPC ......... *H10K 59/1315* (2023.02); *H10K 50/30* (2023.02); *H10K 59/125* (2023.02)

(58) Field of Classification Search
CPC ... H10K 59/1315; H10K 59/125; H10K 50/30
See application file for complete search history.

(56) References Cited

U.S. PATENT DOCUMENTS

2006/0103290 A1 5/2006 Suh et al.
2006/0202934 A1 9/2006 Shin et al.
(Continued)

FOREIGN PATENT DOCUMENTS

| CN | 107579093 A | 1/2018 |
| JP | 2014505324 A | 2/2014 |
| WO | 2009036071 A2 | 3/2009 |

OTHER PUBLICATIONS

International Search Report for PCT/JP2021/003656 mailed Jul. 13, 2021.
(Continued)

*Primary Examiner* — Anne M Hines
(74) *Attorney, Agent, or Firm* — Thomas | Horstemyer, LLP

(57) ABSTRACT

A device configuration designed to mitigate display defects resulting from voltage drops in current supply lines offers a display with better display quality. The display includes: a plurality of VOLETs arranged in arrays along a first direction and a second direction; a data line supplying a voltage for controlling gate electrodes of the plurality of VOLETs; TFTs each connected between a gate electrode of each of the VOLET and the data line and controlling voltage supply to the gate electrodes of the VOLETs; a gate line connected to
(Continued)

gate electrodes of the TFTs and transmitting a signal that controls the TFTs; a plurality of current supply lines extending along the first direction and supplying a current to each of a group of VOLETs aligned along the first direction; and an auxiliary line extending along the second direction and connecting at least two of the plurality of current supply lines.

14 Claims, 9 Drawing Sheets

(56) References Cited

U.S. PATENT DOCUMENTS

| | | |
|---|---|---|
| 2010/0244710 A1 | 9/2010 | Obata et al. |
| 2012/0074423 A1* | 3/2012 | Kanegae ............ H10K 59/1315 |
| | | 257/E33.053 |
| 2013/0240842 A1* | 9/2013 | Rinzler ............... H01L 29/1606 |
| | | 257/329 |

OTHER PUBLICATIONS

Office Action for JP 2021-002734 drafted Jun. 6, 2025 (English translation provided by Applicant).
Taiwan Office Action Application No. 110104346 mailed Nov. 26, 2024 (machine translation).
CN107579093 published on Jan. 12, 2018 (Translation from Global Dossier Service by EPO).

* cited by examiner

DISPLAY

CROSS-REFERENCE TO RELATED APPLICATIONS

This application is a national stage entry pursuant to 35 U.S.C. § 371 of Patent Cooperation Treaty (PCT) international application No. PCT/JP2021/003656, filed on Feb. 2, 2021, which claims priority to, and the benefit of, U.S. provisional application No. 63/142,143, filed on Jan. 27, 2021, and JP patent application No. 2020-019527, filed on Feb. 7, 2020 and JP patent application No. 2021-002734, filed on Jan. 12, 2021, which are all hereby incorporated by reference in their entireties.

TECHNICAL FIELD

The present invention relates to a display.

BACKGROUND ART

With advanced application of organic semiconductor devices to practical use as light source devices in recent years, displays that use organic semiconductor devices as light source devices have become commercially available. Research is continuously carried out today for the development of displays that use organic semiconductor devices as light source devices, in search of ways to achieve higher luminance, higher precision, lower power consumption, and longer life for further performance improvements.

The pixel of an existing display that uses an organic semiconductor device as the light emitting device is made up of an organic light emitting diode (also referred to as "OLED"), and a transistor that controls the current flowing through the organic light emitting diode. An organic light emitting diode is a device that emits light in accordance with a current input from a thin-film transistor (also referred to as "TFT") formed on a substrate in an organic EL layer sandwiched between an anode electrode and a cathode electrode.

In comparison, Patent Document 1 listed below describes a vertical organic light emitting transistor (also referred to as "VOLET") used as a device for enabling a reduction in the number of control devices and an increase in light emitting area to achieve higher luminance. The vertical organic light emitting transistor emits light in accordance with the amount of current flowing through the transistor itself, wherein the transistor adjusts the flow of current by controlling the voltage applied to the gate electrode. Patent Document 2 listed below describes a display that uses a vertical organic light emitting transistor, whereby the display is supposedly expected to have a significantly increased luminance.

PTL 1: Patent Document 1: WO 2009/036071
PTL 2: Patent Document 2: JP-A-2014-505324

SUMMARY OF THE INVENTION

Displays have found a wide variety of applications in recent years such as advertisements in station buildings, backgrounds in event sites, etc., other than the use as domestic TV or PC displays. Therefore, how to enable an increase in size has become a significant issue in the current development of displays along with the performance improvements mentioned above.

In a display that uses organic semiconductors, an organic light emitting diode and a thin-film transistor that make up a pixel are disposed in a display part, while drivers that drive these devices are disposed in an outer periphery of the display part. This is still a common configuration adopted in many displays today.

Increasing the size of the display with this configuration causes an increase in the transmission distance of the signals output from the various drivers disposed in the outer periphery to control or drive the various devices over the entire display part. The longer the wiring lines connecting the drivers and devices, the larger the resistance of the wiring lines between the drivers and devices. The increased resistance of the wiring lines may lead to a voltage drop caused by the passing current (also referred to as "IR-Drop"), or cause a signal delay or degradation.

A current supply line for supplying a current to light emitting devices is susceptible in particular to an increase in resistance, i.e., even when the same voltage is applied to cause a current to flow in each light emitting device from a current supply part, the voltage reduces in accordance with the resistance of the wiring line and the passing current as the distance from the current supply part increases. This results in the amount of current that is actually supplied being smaller than the current value required for the display of image data. This discrepancy may build up to a point where a display defect is so evident that the viewer can visually perceive the gradual decline in luminance. Moreover, since a current supply line is shared by a group of light emitting devices aligned in a row in many cases, variations in resistance of the wiring of the current supply line lead to a difference in luminance between the lines, which results in a display defect where lines appear.

As one measure to solve the problem described above, it may be possible to apply the method described in Patent Document 3 listed above wherein the emission luminance of each pixel is detected and a voltage in consideration of the voltage drop is supplied to the data line, to the current supply line. However, an additional complex circuit will take up a substantial part of the light emitting region and inhibit the capacity to increase the luminance. Moreover, the display may become more prone to malfunctions and failures due to the use of more devices.

It may also be possible to use the outer peripheral parts where drivers are disposed, or to add external equipment. However, enlargement of the outer peripheral parts or addition of external equipment will pose limitations on the mode of use, and installation location, of the display, which is contrary to the desirability of variation in application purposes.

Further, in feedback control or the like where a voltage is applied in consideration of fluctuations, it is possible that errors occur depending on the calculation method, because of which it may as well be the case where the voltage correction is not sufficient to prevent the change in luminance from being recognized as a display defect. Therefore, the measure to prevent display defects should preferably be provided as a device structure rather than by correction of changes in luminance.

The applicants of the present invention, in investigating displays that use vertical organic light emitting transistors, have further found the following issue with regard to the vertical organic light emitting transistors. A vertical organic light emitting transistor includes a source electrode, a gate electrode, and a drain electrode, similarly to a field effect transistor.

Unlike field effect transistors such as thin-film transistors, a vertical organic light emitting transistor is provided with an EL device and an organic semiconductor layer between the source electrode and the drain electrode. The material properties of these layers cause the vertical organic light emitting transistor to have a characteristic feature that the current flowing between the source electrode (anode electrode) and the drain electrode (cathode electrode) is more susceptible to the voltage applied across these electrodes as compared to a field effect transistor such as a thin-film transistor. Namely, the current supply line is influenced more by a voltage drop than existing configurations with organic light emitting diodes and thin-film transistors, because of which the display defects mentioned above may appear more readily.

In view of the problems described above, it is an object of the present invention to provide a device configuration designed to mitigate display defects resulting from voltage drops in current supply lines, to offer a display with better display quality.

A display of the present invention includes:

a plurality of vertical organic light emitting transistors arranged in arrays along a first direction and a second direction orthogonal to the first direction;

a data line supplying a voltage for controlling gate electrodes of the plurality of vertical organic light emitting transistors;

thin-film transistors each connected between a gate electrode of each of the vertical organic light emitting transistors and the data line and controlling voltage supply to the gate electrodes of the vertical organic light emitting transistors;

a gate line connected to gate electrodes of the thin-film transistors and transmitting a signal that controls the thin-film transistors;

a plurality of current supply lines extending along the first direction and supplying a current to each of a group of vertical organic light emitting transistors aligned along the first direction; and at least one auxiliary line extending along the second direction and connecting at least two of the plurality of current supply lines.

The current supply lines for supplying a current to the vertical organic light emitting transistors extend along the first direction, and are shared by a group of organic light-emitting transistors arranged along the first direction. The plurality of the current supply lines are arranged along the second direction. At least two of the current supply lines are connected by the auxiliary line extending along the second direction.

As long as two or more current supply lines are connected, there may be any number of auxiliary lines. While it is preferable that current supply lines connected by the auxiliary line be positioned close to each other, current supply lines adjacent each other need not necessarily be connected to each other.

The configuration described above reduces a local voltage drop even in a case where a large local voltage drop is inevitable in one of the current supply lines, because voltage is supplied by other current supply lines connected thereto by the auxiliary line so that the voltage is made uniform among the current supply lines. This makes a region or line of pixels having an extremely lower luminance than the surrounding pixels hardly recognizable, whereby the display quality is significantly improved.

Moreover, with the auxiliary line connecting the current supply lines along the second direction according to the configuration described above, a voltage drop does not just occur in each current supply line but over the entire screen, resulting in luminance reduction in a gradational manner. Therefore, if voltage is supplied in consideration of the voltage drop as in the configuration described above, the voltage is corrected in a gradational manner and adjusted two-dimensionally and collectively in response to the luminance tendency of the entire screen, rather than voltage correction for each of the current supply lines. Accordingly, complex calculations for luminance correction per each current supply line are unnecessary. Moreover, even if there are errors resulting from the calculation method, a local display defect hardly occurs since voltage is corrected over the entire screen, so that display defects are unlikely to be recognized.

In the display described above, the auxiliary line may be formed closer to a substrate than a source electrode of the vertical organic light emitting transistor.

The pixel configuration of a display that uses organic light emitting diodes includes, at minimum, two thin-film transistors in a lower layer and an organic light emitting diode in an upper layer, the upper layer being the one away from the substrate. On the other hand, the pixel configuration of a display that uses vertical organic light emitting transistors includes, at minimum, one thin-film transistor in the lower layer and a vertical organic light emitting transistor in the upper layer. Therefore, the region for another thin-film transistor that is not needed in the lower layer is made available. Using this region as a wiring region allows for retention or enhancement of the luminance as compared to existing pixel configurations, as well as formation of auxiliary lines.

In the display described above, the auxiliary line may include a wiring line made of a material that makes up the gate line and formed in a layer in which the gate line is provided.

The gate electrode of the thin-film transistor is formed in a layer under the source electrode and drain electrode of the thin-film transistor. In many cases, therefore, the gate line connected to the gate electrode of the thin-film transistor is provided in the lowermost layer closest to the substrate, while the data line and power source line connected to light emitting devices such as organic light emitting diodes and vertical organic light emitting transistors are provided in a layer over the gate line so that they can readily be connected to the light emitting devices. That is, the layer where the gate line is provided is easier to utilize for the wiring as compared to other layers.

Moreover, the display that uses vertical organic light emitting transistors has one less thin-film transistor as compared to displays that use organic light emitting diodes, so that the region for the thin-film transistor that is not needed can be utilized, which allows for formation of auxiliary lines while minimizing a size reduction of the light emitting region and avoiding a significant decline of luminance.

The gate line is a wiring line for transmitting signals for high-speed control of thin-film transistors and therefore made of a material having a lower resistance than the materials of other layers. Therefore, making the auxiliary lines of the same material as the gate line enables a configuration in which the influence of the resistance of the auxiliary lines on the current supply lines connected by the auxiliary lines is reduced, so that the voltage is made uniform among the current supply lines.

In the display described above, the auxiliary line may include a wiring line made of a material that makes up the gate electrode of the vertical organic light emitting transistor and configured in a layer in which the gate electrode of the vertical organic light emitting transistor is provided.

The configuration described above allows the auxiliary lines to be formed in a layer under the vertical organic light emitting transistors, for example, even when a complex control circuit needs to be configured and a region for the wiring is hard to secure. The auxiliary line may also be configured to extend in parallel in a layer over the auxiliary line that is formed in the same layer as the gate line as described above, which further enables the voltage to be made uniform among the current supply lines.

A display of the present invention includes:

a plurality of vertical organic light emitting transistors arranged in arrays along a first direction and a second direction orthogonal to the first direction;

a data line supplying a voltage for controlling gate electrodes of the plurality of vertical organic light emitting transistors;

thin-film transistors each connected between the gate electrode of each of the vertical organic light emitting transistors and the data line and controlling voltage supply to the gate electrodes of the vertical organic light emitting transistors; and a gate line connected to the gate electrodes of the thin-film transistors and transmitting a signal that controls the thin-film transistors, at least two of the plurality of vertical organic light emitting transistors adjacent each other having a source electrode layer continuously formed therebetween.

In the configuration described above, the source electrode layer of one vertical organic light emitting transistor is directly connected to the source electrode layer of the adjacent vertical organic light emitting transistor, so that there is created no large difference in voltage applied to the respective source electrode layers of the vertical organic light emitting transistors.

The configuration described above also allows for formation of the source electrode layer of the vertical organic light emitting transistors in a large area so that high-precision patterning is not required. Therefore, the source electrode layer of the vertical organic light emitting transistors can be formed by more simple patterning such as inkjet screen printing, for example, which is one printing method. This helps suppress an increase in the number of production steps and processing costs that may be caused by formation and patterning of the source electrode layer of the vertical organic light emitting transistors.

The source electrodes of the vertical organic light emitting transistors coupled together enable mutual distribution of current between the surrounding connected pixels, which makes formation of some of the contact holes unnecessary. Simplification of the formation method of contact holes can suppress an increase in the processing costs, as well as a drop in the production yield of panels that may result from contact failures.

The display described above may further include a plurality of current supply lines extending along the first direction and supplying a current to each of a group of vertical organic light emitting transistors aligned along the first direction.

Since the source electrode layer is continuous between adjacent ones of the plurality of vertical organic light emitting transistors in the display described above, the current is supplied to the vertical organic light emitting transistors via the source electrodes. With the additional current supply lines, the resistance between the source electrodes of the vertical organic light emitting transistors is reduced, so that the voltage at the source electrode of each vertical organic light emitting transistor is made more uniform.

The display described above may further include at least one auxiliary line extending along the second direction and connecting at least two of the plurality of current supply lines.

In the display described above, the auxiliary line may be formed closer to a substrate than a source electrode of the vertical organic light emitting transistor.

In the display described above, the auxiliary line may include a wiring line made of a material that makes up the gate line and formed in a layer in which the gate line is provided.

In the display described above, the auxiliary line may include a wiring line made of a material that makes up the gate electrode of the vertical organic light emitting transistor and configured in a layer in which the gate electrode of the vertical organic light emitting transistor is provided.

Each of the configurations described above causes the resistance between the source electrodes of the vertical organic light emitting transistors to be smaller, which allows the voltage at the source electrodes of the vertical organic light emitting transistors to be more uniform.

According to the present invention, a display with better display quality is realized by a device configuration designed to mitigate display defects resulting from voltage drops in current supply lines.

DETAILED DESCRIPTION OF THE PREFERRED EMBODIMENTS

Figure 1:
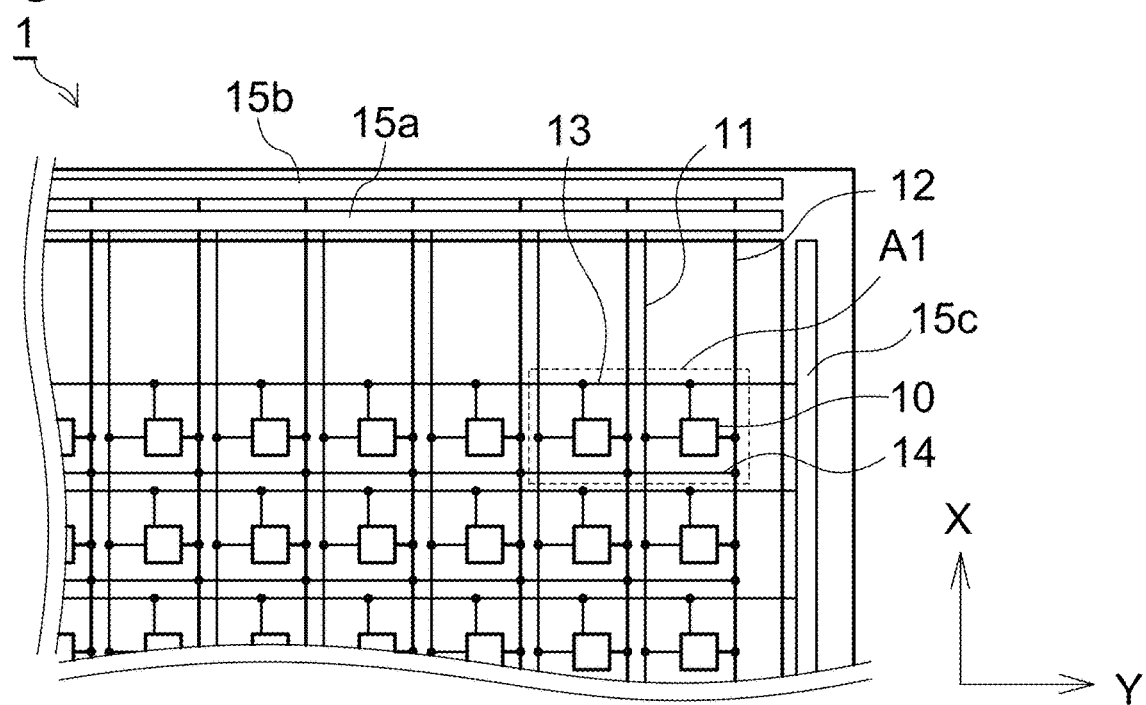
FIG. 1 is a schematic configuration diagram of a part of a display in one embodiment.

Hereinafter, a configuration of a display of the present invention is described with reference to the drawings. The drawings referred to below each provide schematic illustrations. The dimensional ratios and numbers of elements in the drawings are not necessarily the same as the actual dimensional ratios and numbers of elements.

First Embodiment

FIG. 1 is a schematic configuration diagram of a part of a display 1 in one embodiment. As illustrated in FIG. 1, the display 1 of this embodiment includes arrays of light emitting parts 10, each including a vertical organic light emitting transistor, data lines 11 that supply a voltage to gate electrodes of the vertical organic light emitting transistors, current supply lines 12 that supply a current to source electrodes of the vertical organic light emitting transistors, gate lines 13 that transmit signals for controlling thin-film transistors, and auxiliary lines 14 that connect the current supply lines 12.

The display 1 also includes, in an outer peripheral part thereof, a source driver 15a that supplies a voltage to the data lines 11 to apply a voltage to the gate electrodes of the vertical organic light emitting transistors in accordance with image data to be displayed, a current supply part 15b that supplies a current to the current supply lines 12 so that a current is supplied to the source electrodes of the vertical organic light emitting transistors, and a gate driver 15c that outputs control signals for the thin-film transistors to the gate lines 13.

Figure 2:
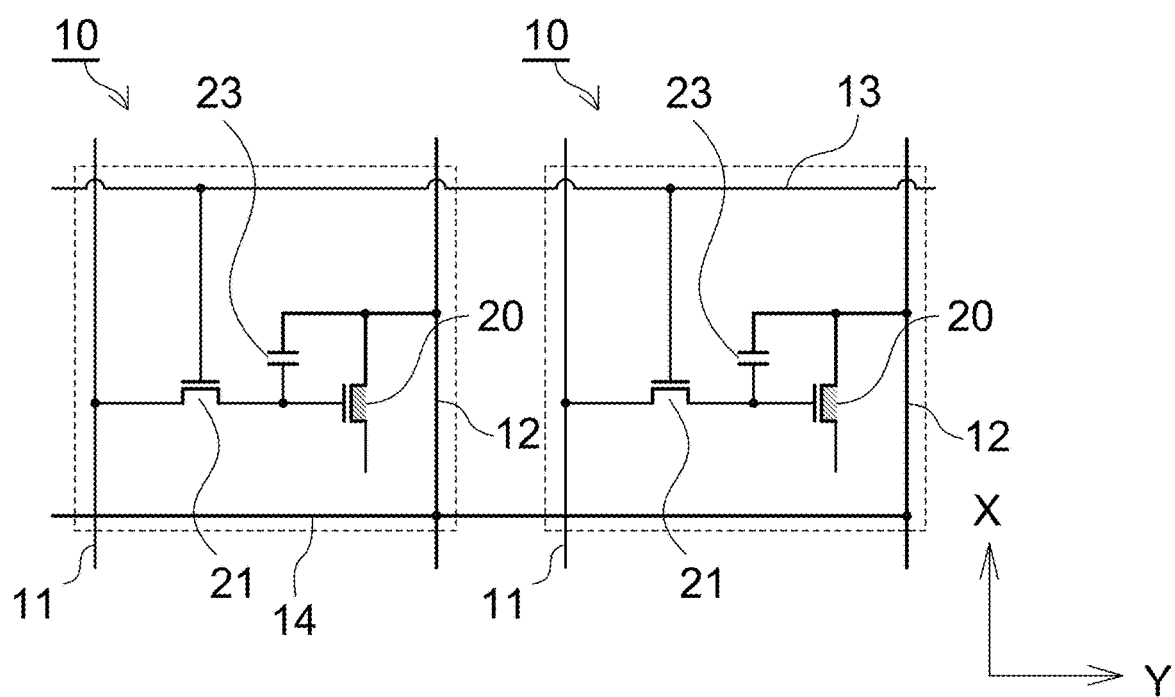
FIG. 2 is a circuit diagram of a light emitting part in region A1 of the display of FIG. 1.

FIG. 2 is a detailed circuit diagram of light emitting parts 10 in region A1 of the display 1 of FIG. 1. As illustrated in FIG. 2, the light emitting part 10 includes a vertical organic light emitting transistor 20, a thin-film transistor 21 that controls voltage supply to the gate electrode of the vertical organic light emitting transistor 20, and a capacitor 23 connected between the source electrode and the gate electrode of the vertical organic light emitting transistor 20. In the description with reference to FIG. 1 and FIG. 2, a direction along which the current supply line 12 extends shall be referred to as the X direction (first direction), and a direction along which the auxiliary line 14 extends shall be referred to as the Y direction (second direction).

The data line 11 is a wiring line for applying a voltage output from the source driver 15a to the gate electrode of the vertical organic light emitting transistor 20 via the thin-film transistor 21 in order to adjust the emission luminance of the vertical organic light emitting transistor 20 in accordance with the image being displayed. While the data lines 11 are formed along the X direction in this embodiment, the data lines may be formed along the Y direction.

The current supply lines 12 are formed along the X direction to be connected to each of the group of vertical organic light emitting transistors 20 aligned along the X direction. Each current supply line 12 supplies a current output from the current supply part 15b to the source electrode of each vertical organic light emitting transistor included in the group of the vertical organic light emitting transistors 20.

The gate lines 13 are connected to the gate electrodes of the thin-film transistors 21 so that the control signals output from the gate driver 15c are transmitted to the gate electrodes of the thin-film transistors 21. Power application and control signal transmission between the gate electrodes of the vertical organic light emitting transistors 20 and the data lines 11 is thus controlled by the thin-film transistors 21 being switched on and off. While the gate lines 13 are formed along the Y direction in this embodiment, the gate lines may be formed along the X direction.

The auxiliary line 14 extends along the Y direction between the light emitting parts 10 aligned along the X direction. The auxiliary line 14 need not necessarily be formed between adjacent ones of all of the light emitting parts 10 aligned along the X direction. While the current supply lines 12 are formed along the X direction and the auxiliary lines 14 are formed along the Y direction in this embodiment, the current supply lines 12 may be formed along the Y direction and the auxiliary lines 14 may be formed along the X direction.

The capacitor 23 is a voltage retaining device between the gate electrode and the source electrode of the vertical organic light emitting transistor 20 disposed to maintain the image being displayed for a predetermined time during the off-state of the thin-film transistor 21.

Figure 3:
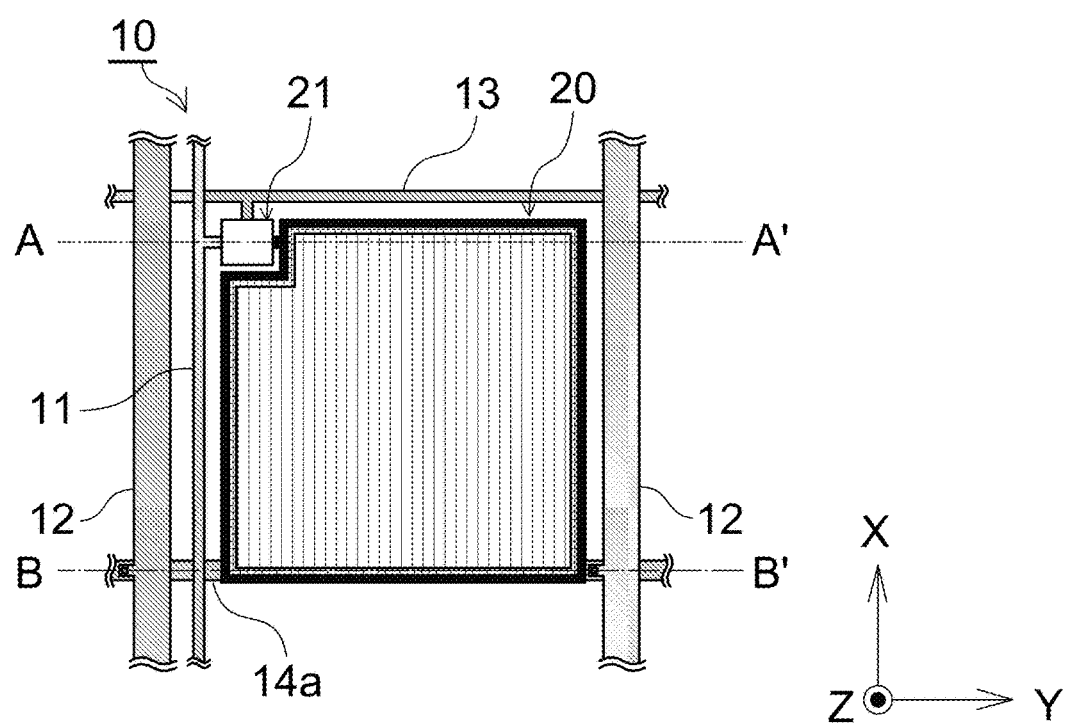
FIG. 3 is a top plan view of a schematic device configuration of the light emitting part and its vicinity in one embodiment.
Figure 4:
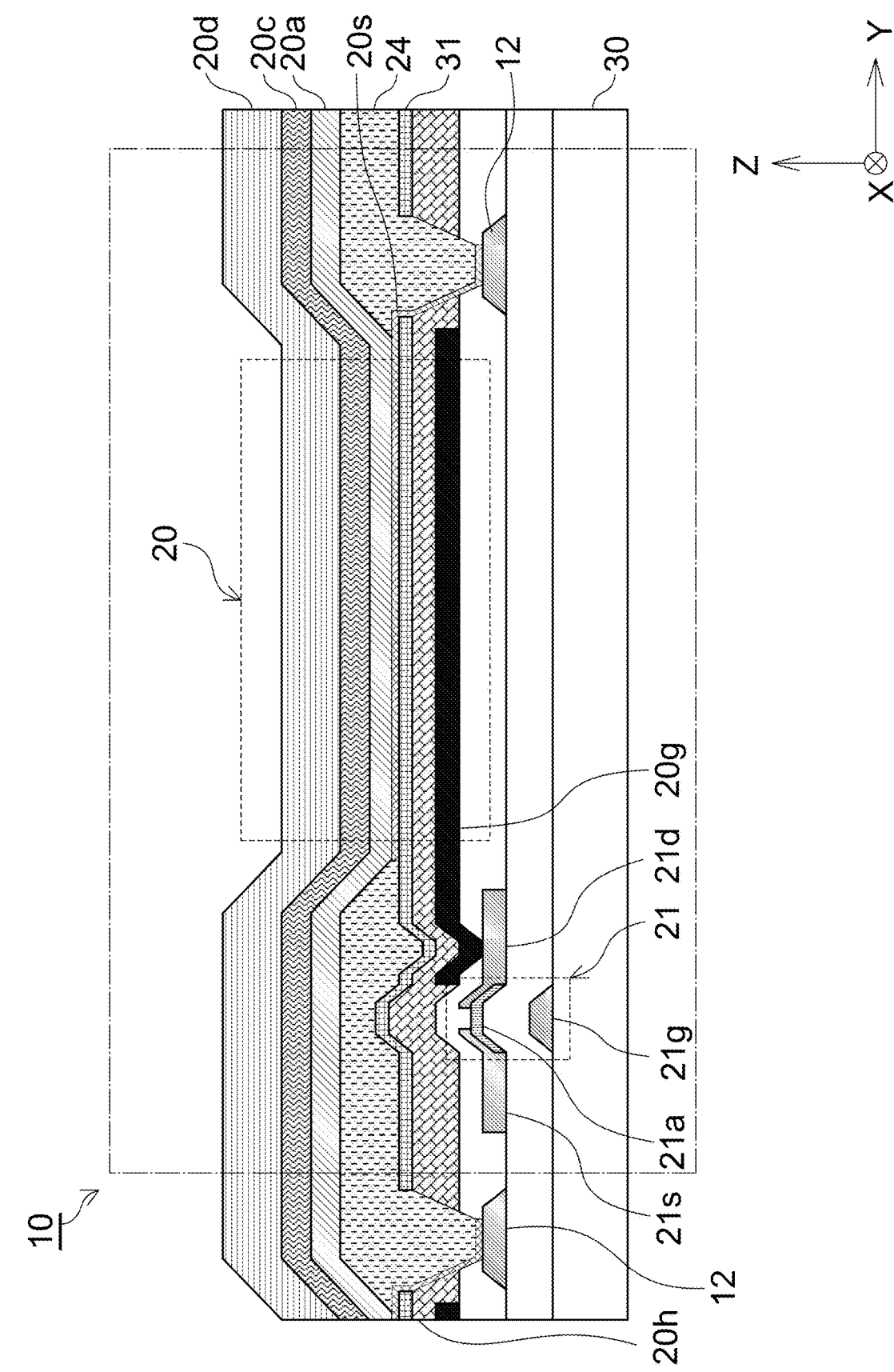
FIG. 4 is a cross-sectional view along A-A' of FIG. 3.

Next, the structure of each device formed on a substrate will be described. FIG. 3 is a top plan view of a schematic device configuration of the light emitting part 10 and its vicinity in one embodiment. FIG. 4 is a cross-sectional view along A-A' of FIG. 3. As illustrated in FIG. 3 and FIG. 4, the vertical organic light emitting transistor 20 and thin-film transistor 21 are provided in a region delineated by the data line 11, current supply lines 12, and gate line 13.

Figure 5:
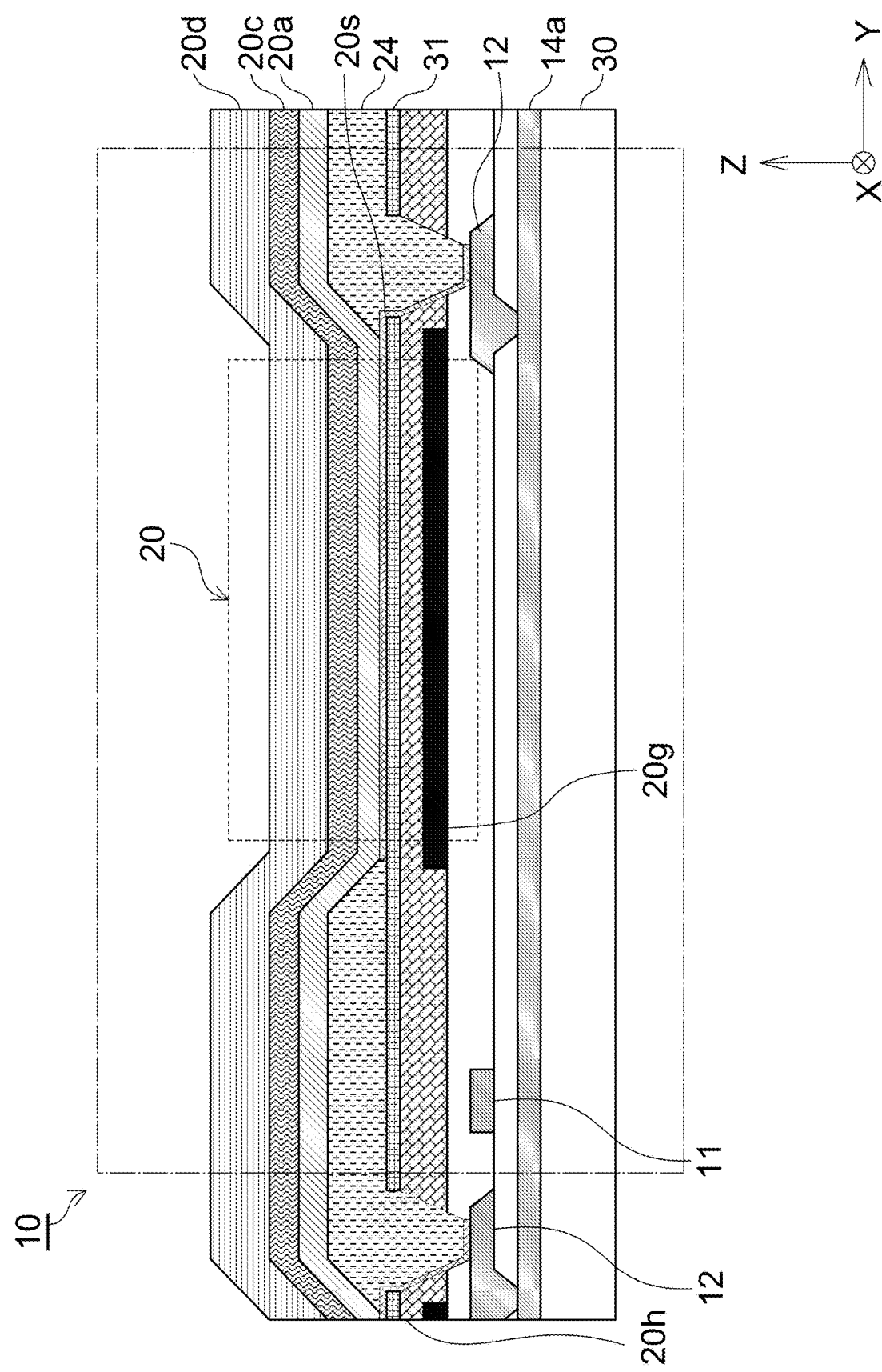
FIG. 5 is a cross-sectional view along B-B' of FIG. 3.

FIG. 5 is a cross-sectional view along B-B' of FIG. 3. As illustrated in FIG. 3 and FIG. 5, the auxiliary line 14 is formed in the same layer as the gate line 13 that is connected to a gate electrode layer 21g of the thin-film transistor 21 and made of the same material as the gate line 13. Hereinafter, the auxiliary line 14 made of the same material and in the same layer as the gate line 13 shall be referred to as a wiring layer auxiliary line 14a.

The substrate 30 is transmissive to light and outputs the light emitted from the vertical organic light emitting transistor 20 to the outside. Specific materials will be described later.

In the following description, the direction along which the data line 11 and current supply lines 12 extend shall be referred to as the X direction, the direction along which the gate line 13 extends as the Y direction, the direction orthogonal to these as the Z direction, and a direction away from the substrate 30 (forward in the Z direction) as an upper layer.

The vertical organic light emitting transistor 20 is configured to include, from the upper layer, a drain electrode layer 20d corresponding to a cathode electrode, an organic EL layer 20c, an organic semiconductor layer 20a, and a source electrode layer 20s formed by coating a surface of a surface layer 31 with a conductive material containing carbon (carbon nanotube in this embodiment), and, in a layer underneath, a gate electrode layer 20g, via a gate insulating layer 20h made of a dielectric material. Voltage application to the gate electrode layer 20g changes the Schottky barrier between the organic semiconductor layer 20a and the source electrode layer 20s, and a current flows from the source electrode layer 20s to the organic semiconductor layer 20a and organic EL layer 20c when a predetermined threshold is exceeded, allowing the vertical organic light emitting transistor 20 to emit light.

In the display 1 of this embodiment, the substrate 30 is made of a material transmissive to visible light. The gate electrode layer 20g and the source electrode layer 20s are both transmissive to visible light, and configured such that there is a gap that allows visible light to pass through, causing the light output from the organic EL layer 20c to pass through the substrate 30 and exit to the outside, whereby images are displayed. This configuration wherein light is passed through the substrate 30 and emitted is referred to as "bottom emission type", and is advantageous in that production is easy due to simple interconnections between electrodes.

The source electrode layer 21s and the drain electrode layer 21d of the thin-film transistor 21 are connected via an oxide semiconductor layer 21a, and the gate electrode layer 21g is formed below the oxide semiconductor layer 21a via an insulating layer or a dielectric layer. A voltage applied to the gate electrode layer 21g creates respective conductive channels in the oxide semiconductor layer 21a so that power is supplied to the source electrode layer 21s and drain electrode layer 21d.

The source electrode layer 21s and the drain electrode layer 21d of the thin-film transistor 21 are connected to the data line 11 and the gate electrode layer 20g of the vertical organic light emitting transistor 20, respectively.

As illustrated in FIG. 3, the vertical organic light emitting transistor 20 is formed to cover substantially the entire region delineated by the data line 11, current supply lines 12, and gate line 13 to achieve a high luminance for the display 1, while the thin-film transistor 21 is formed to take up as little space as possible in a corner of this delineated region so as to minimize the influence on the light emitting region of the vertical organic light emitting transistor 20.

The capacitor 23 is not shown in FIG. 3 to FIG. 5. The vertical organic light emitting transistor 20 of this embodiment includes the capacitor 23 as a parasitic device, with the source electrode layer 20s and the gate electrode layer 20g being arranged opposite each other via the gate insulating layer 20h as shown in FIG. 4 or FIG. 5. This capacitor 23 is also capable of serving the function of voltage retention. Another capacitor may be added if the capacitance provided by this capacitor 23 configured as a parasitic device is not sufficient.

Below, examples of materials that may be used for respective layers are listed.

For the gate line 13 and wiring layer auxiliary line 14a, aluminum (Al), titanium (Ti), molybdenum (Mo), tungsten (W), niobium (Nb), magnesium (Mg), silver (Ag), copper (Cu), and metal alloys of combinations thereof may be adopted.

For the substrate 30, glass materials, or plastics such as PET (Poly Ethylene Terephthalate), PEN (Poly Ethylene Naphthalate), and polyimide may be adopted.

For the drain electrode layer 20d of the vertical organic light emitting transistor 20, single- or multi-layer graphene, carbon nanotube, aluminum (Al), silver (Ag), lithium fluoride (LiF), molybdenum oxide (MoXOY), indium tin oxide (ITO), and zinc oxide (ZnO) may be adopted.

For the gate electrode layer 20g of the vertical organic light emitting transistor 20, metal- or non-doped transparent conductive oxides such as zinc oxide (ZnO), indium oxide (In2O3), tin dioxide (SnO2), and cadmium oxide (CdO) which may be doped with a metal such as aluminum (Al), tin (Sn), yttrium (Y), scandium (Sc), and gallium (Ga), and materials containing combinations thereof, or, aluminum (Al), gold (Au), silver (Ag), platinum (Pt), cadmium (Cd), nickel (Ni), and tantalum (Ta), and combinations thereof, and p- or n-doped silicon (Si) or gallium arsenide (GaAs) may be adopted.

For the gate insulating layer 20h between the surface layer 31 and the gate electrode layer 20g of the vertical organic light emitting transistor 20, silicon oxide (SiOX), aluminum oxide (Al2O3), silicon nitride (Si3N4), yttrium oxide (Y2O3), lead titanate (PbTiOX), aluminum titanate (AlTiOX), glass, and organic compounds such as parylene polymer, polystyrene, polyimide, polyvinylphenol, polymethyl methacrylate, and fluoropolymer may be adopted.

Materials that can be adopted for the organic semiconductor layer 20a of the vertical organic light emitting transistor 20 include: linear annulated polycyclic aromatic compounds (or acene compounds) such as naphthalene, anthracene, rubrene, tetracene, pentacene, hexacene, and derivatives thereof; pigments such as, for example, copper phthalocyanine (CuPc) compounds, azo compounds, perylene compounds and derivatives thereof; low-molecular compounds such as, for example, hydrazone compounds, triphenyl methane compounds, diphenylmethane compounds, stilbene compounds, arylvinyl compounds, pyrazoline compounds, triphenylamine derivatives (TPD), arylamine compounds, low-molecular weight amine derivatives (α-NPD), 2,2',7,7'-tetrakis(diphenylamino)-9,9'-spirobifluorene (Spiro-TAD), N,N'-di(1-naphthyl)-N,N'-diphenyl-4,4'-diamonobiphenyl (Spiro-NPB), 4,4',4''-tris[N-3-methylphenyl-N-phenylamino]-triphenylamine (mMTDATA), 2,2',7,7'-tetrakis(2,2-diphenylvinyl)-9,9-spirobifluorene (Spiro-DPVBi), 4,4'-bis(2,2-diphenylvinyl)biphenyl (DPVBi), (8-quinolinolate)aluminum (Alq), tris(8-quinolinolato)aluminum (Alq3), tris(4-methyl-8quinolinolato)aluminum (Almq3), and derivatives thereof; polymer compounds such as, for example, poly-thiophene, poly(p-phenylenevinylene) (PPV), polymers containing biphenyl groups, polymers containing dialkoxy groups, alkoxyphenyl-PPV, phenyl-PPV, phenyl/dialkoxy-PPV copolymer, poly(2-methoxy-5-(2'-ethylhexyloxy)-1,4-phenylenevinylene) (MEH-PPV), poly (ethylenedioxythiophene) (PEDOT), poly(styrenesulfonic acid) (PSS), poly(aniline) (PAM), poly(N-vinylcarbazole), poly(vinylpyrene), poly(vinylanthracene), pyrene-folmaldehyde resin, halogenated ethylcarbazole-folmaldehyde resin, and modifications thereof; n-type transport organic low molecules, oligomers, or polymers, such as, for example, 5,5_-diperfluorohexyl carbonyl-2,2_:5_,2_:5_,2_-quaterthiophene (DFHCO-4T), DFH-4T, DFCO-4T, P(NDI2OD-T2), PDI8-CN2, PDIF-CN2, and F16CuPc, fullerene, naphthalene, and perylene, and oligothiophene derivatives; and aromatic compounds having a thiophene ring, such as thieno [3,2-b]thiophene, dinaphthyl[2,3-b:2',3'-f]thieno[3,2-b]thiophene (DNTT), 2-decyl-7-phenyl[1]benzothieno[3,2-b][1] benzothiophene (BTBT), and so on.

Suitable selection of organic semiconductors with a matching energy level allows for favorable use of a hole injection layer, a hole transport layer, an organic EL layer, an electron transport layer, an electron injection layer, and so on for the vertical organic light emitting transistor 20, which are used in a standard OLED display. The material of the organic EL layer 20c is selected from the group above so that light emitted to the outside is adjusted to have a color such as red, green, and blue. Alternatively, the vertical organic light emitting transistor 20 may be configured to emit white light, i.e., the same vertical organic light emitting transistor 20 may be configured to selectively emit light of a desired color using a color filter.

The surface layer 31 is a layer formed over the gate insulating layer 20h for the purpose of securing the source electrode layer 20s (in particular, CNT layer). The surface layer 31 may be formed by applying a composition containing a binder resin made of a silane coupling material, an acrylic resin and the like.

For the oxide semiconductor layer 21a included in the thin-film transistor 21, In—Ga—Zn—O semiconductors, Zn—O semiconductors (ZnO), In—Zn—O semiconductors (IZO(Registered Trademark)), Zn—Ti—O semiconductors (ZTO), Cd—Ge—O semiconductors, Cd—Pb—O semiconductors, CdO (cadmium oxide), Mg—Zn—O semiconductors, In—Sn—Zn—O semiconductors (e.g., In2O3-SnO2-ZnO), In—Ga—Sn—O semiconductors, and so on, may be adopted.

While the thin-film transistor 21 in this embodiment is an oxide semiconductor, the thin-film transistor may be made of amorphous silicon. The semiconductor may be either p-type or n-type. Any of the configurations, including, specifically, a staggered type, an inverted staggered type, a coplanar type, an inverted coplanar type, and so on, may be adopted.

A bank layer 24 is formed between the organic semiconductor layer 20a and the surface layer 31 for insulation. At points where the source electrode layer 20s is connected to the data line 11, the bank layer 24 is formed such as to fill the gap provided in the surface layer 31 and gate insulating layer 20h for allowing electrical connection.

For the vertical organic light emitting transistor 20, the vertical organic light emitting transistor 20 that is described in Patent Documents 1 and 2 mentioned above may be employed. Further, the configuration described in Patent Document 3 may also be adopted.

The configuration described above wherein the current supply lines 12 are connected by the wiring layer auxiliary lines 14a allows the connection points between the current supply lines 12 and the wiring layer auxiliary lines 14a to have the same voltage value as that at the connection points of other connected current supply lines 12. Namely, in the event of an extreme local voltage drop due to variations in the resistance of the current supply lines 12, the voltage is lifted up by other current supply lines 12 connected to the wiring layer auxiliary lines 14a. The more there are connection points between the current supply lines 12 and the wiring layer auxiliary lines 14a as in this embodiment, the more entirely the voltage of the current supply lines 12 is made uniform over the display 1.

The voltage of the current supply lines 12 connected by the wiring layer auxiliary lines 14a is made uniform in this way. Thus the display 1 with better display quality, wherein a local voltage drop rarely occurs in each current supply line 12 so that display defects are unlikely to be recognized, is realized.

Second Embodiment

The configuration of a second embodiment of the display 1 of the present invention will be described, mainly centering on the points different from the first embodiment.

Figure 6:
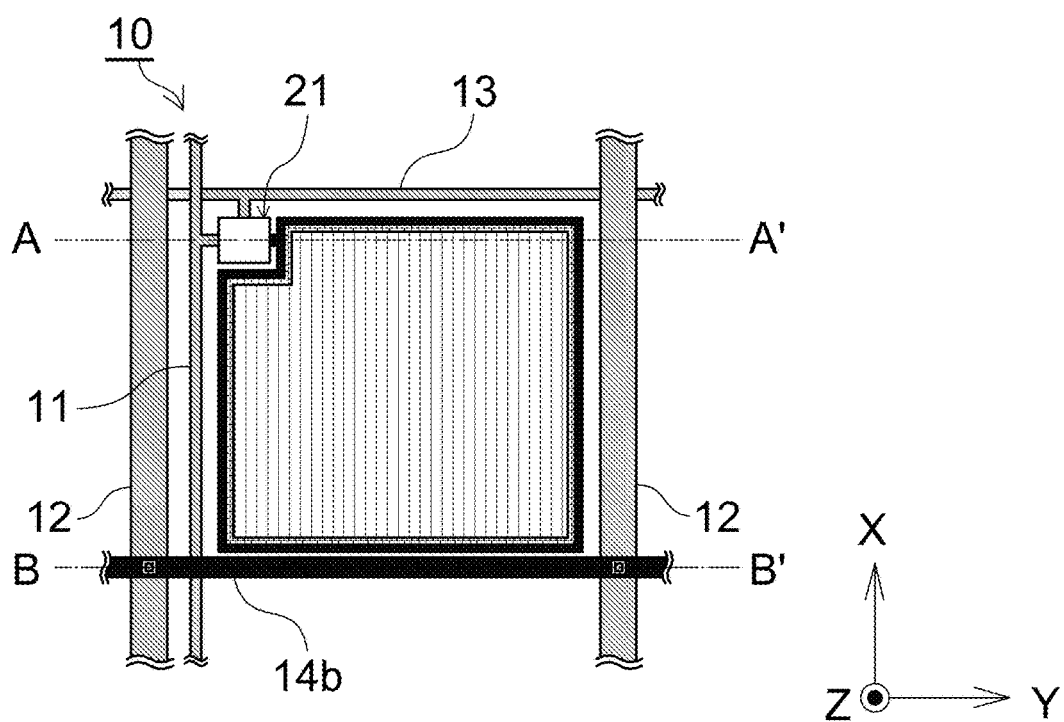
FIG. 6 is a top plan view of a schematic device configuration of the light emitting part and its vicinity in one embodiment.
Figure 7:
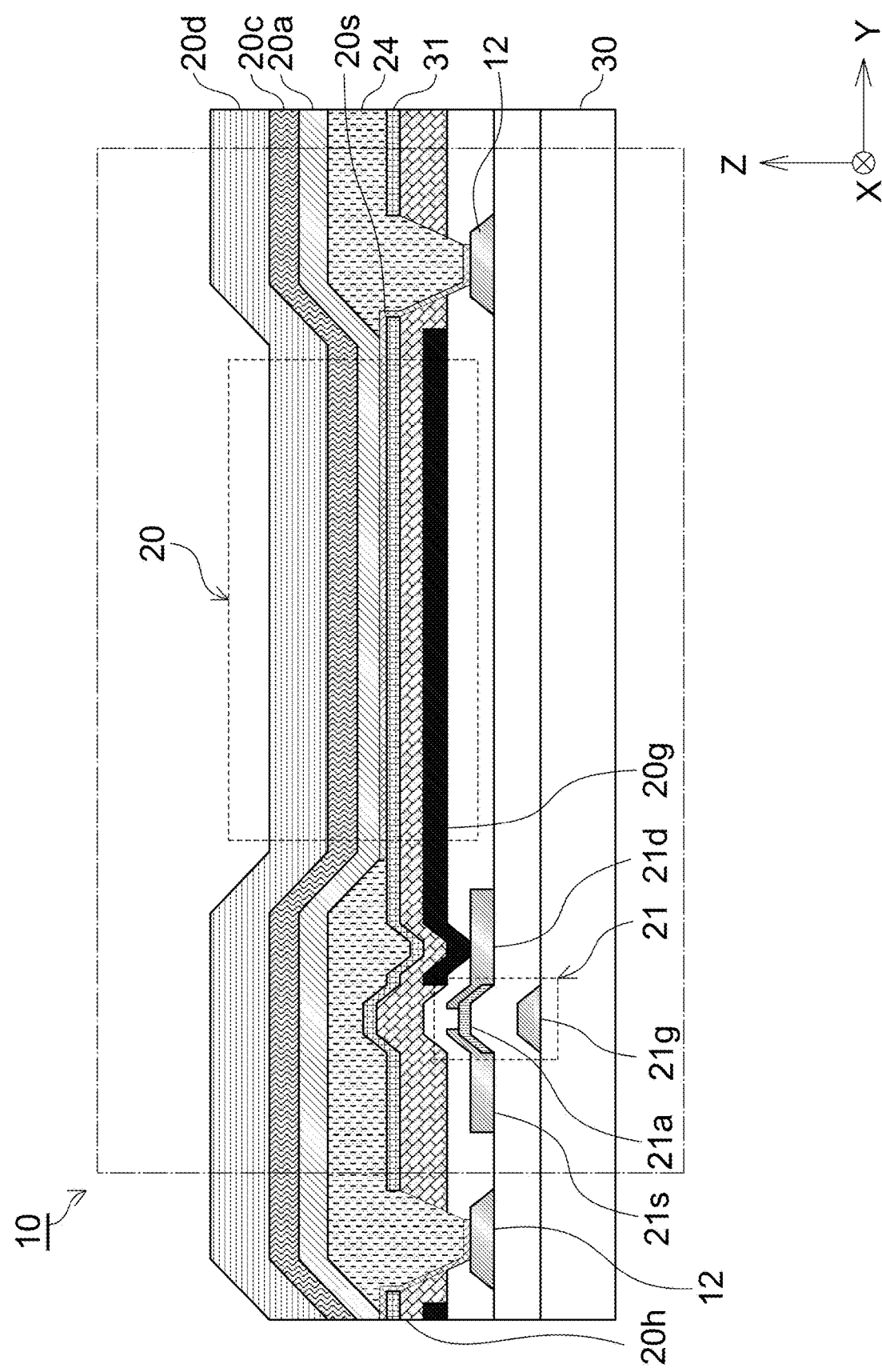
FIG. 7 is a cross-sectional view along A-A' of FIG. 6.
Figure 8:
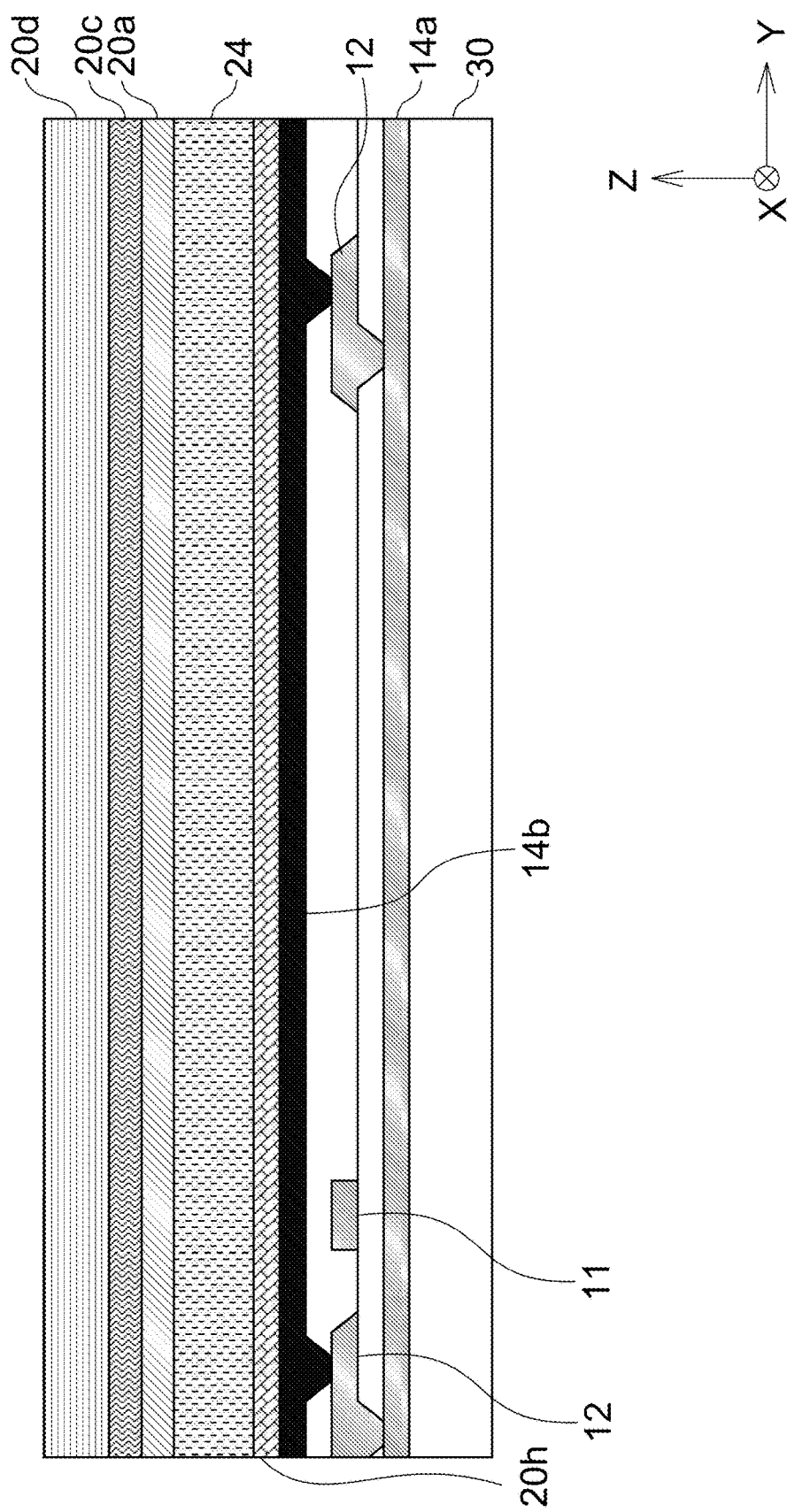
FIG. 8 is a cross-sectional view along B-B' of FIG. 6.

FIG. 6 is a top plan view of a schematic device configuration of the light emitting part 10 and its vicinity in one embodiment. FIG. 7 is a cross-sectional view along A-A' of FIG. 6. FIG. 7, which is a cross-sectional view along A-A' of FIG. 6, illustrates the same configuration as the first embodiment in FIG. 4. FIG. 8 is a cross-sectional view along B-B of FIG. 6. As illustrated in FIG. 6 and FIG. 8, in the second embodiment, in addition to the wiring layer auxiliary line 14a, an electrode layer auxiliary line 14b made of the same material as the gate electrode layer 20g is formed in parallel thereto in the same layer as the gate electrode layer 20g of the vertical organic light emitting transistor 20.

Since the electrode layer auxiliary line 14b is configured in the same layer as the gate electrode layer 20g of the vertical organic light emitting transistor 20 as noted above, this auxiliary line cannot be provided in the region where the vertical organic light emitting transistor 20 is formed. Namely, the electrode layer auxiliary line is formed in a different region from where there is the vertical organic light emitting transistor 20. However, since the wiring layer auxiliary line 14a and the electrode layer auxiliary line 14b are formed in different layers as illustrated in FIG. 6 and FIG. 8, they can be overlapped in the Z direction.

That is, this configuration allows the respective resistance values of both auxiliary lines 14 (14a and 14b) to be reduced while minimizing a size reduction of the light emitting region. The smaller the resistance of the auxiliary lines 14 (14a and 14b), the smaller the voltage drop caused by the current flowing through the auxiliary lines 14 (14a and 14b), which enables the voltage difference in each current supply line 12 to be reduced even more. This further ensures that local voltage drops rarely occur in each current supply line 12, and allows for realization of the display 1 with better display quality.

Third Embodiment

The configuration of a third embodiment of the display 1 of the present invention will be described, mainly centering on the points different from the first and second embodiments.

While the description given above outlines a configuration where the wiring layer auxiliary lines 14a alone are provided, and a configuration where both the wiring layer auxiliary lines 14a and the electrode layer auxiliary lines 14b are provided, it is also possible to provide only the electrode layer auxiliary lines 14b.

Fourth Embodiment

The configuration of a fourth embodiment of the display 1 of the present invention will be described, mainly centering on the points different from the first, second, and third embodiments.

Figure 9:
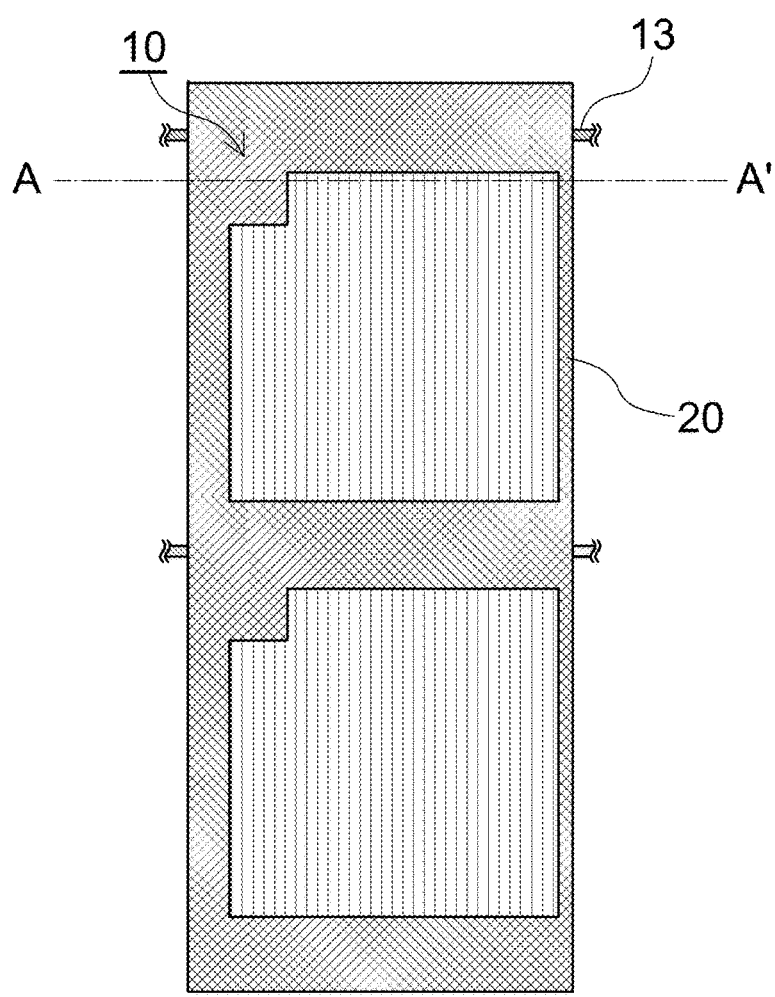
FIG. 9 is a top plan view of a schematic device configuration of the light emitting part and its vicinity in one embodiment.
Figure 9:
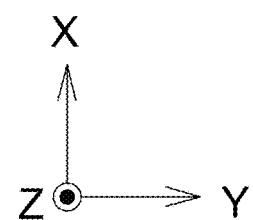
Figure 10:
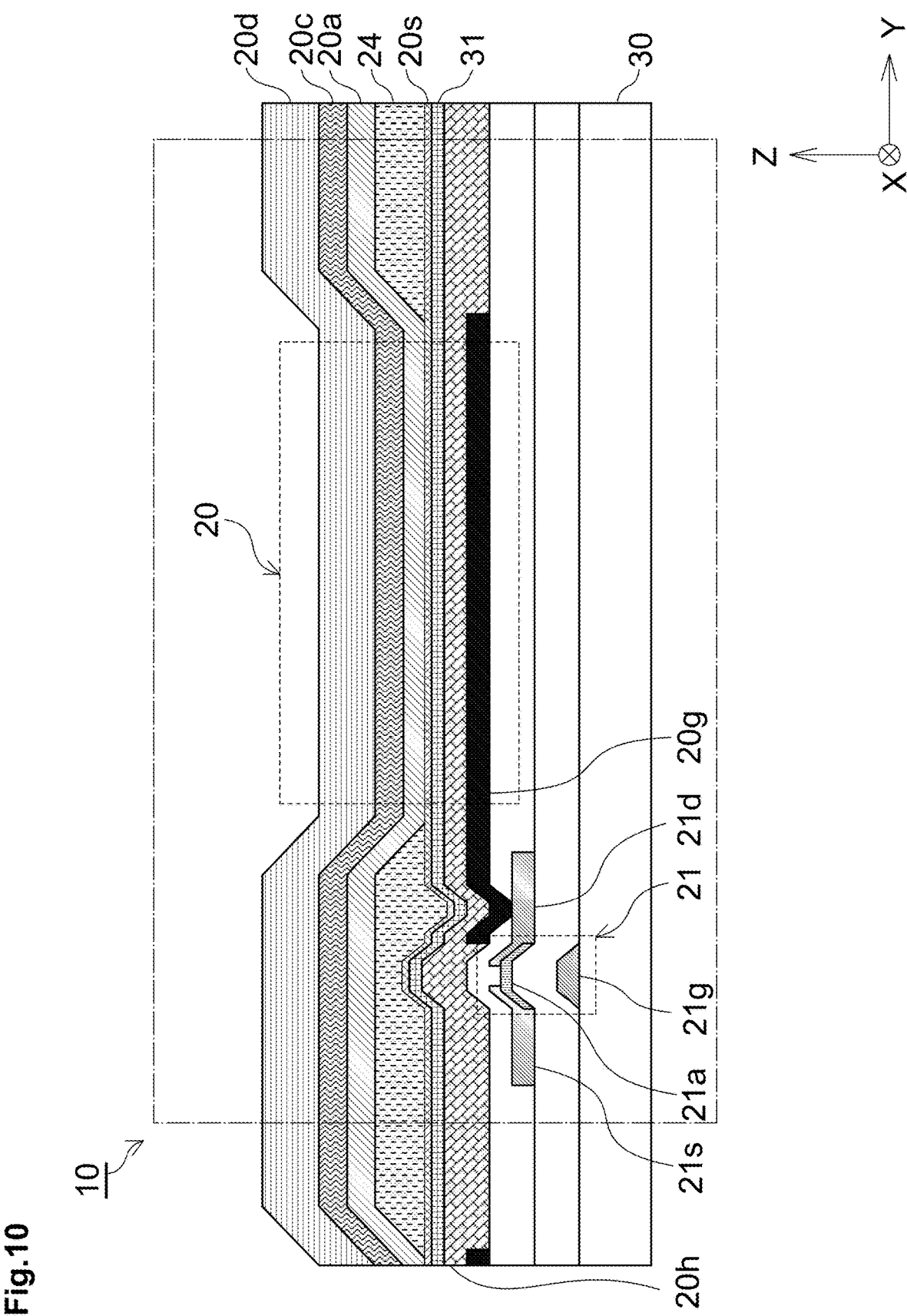
FIG. 10 is a cross-sectional view along A-A' of FIG. 9.

FIG. 9 is a top plan view of a schematic device configuration of the light emitting part 10 and its vicinity in one embodiment. FIG. 10 is a cross-sectional view along A-A' of FIG. 9. As illustrated in FIG. 9 and FIG. 10, in the fourth embodiment, the source electrode layer 20s of the vertical organic light emitting transistor 20 extends continuously between at least two or more pixels so that it substantially functions as the current supply line 12. Additionally, during the display 1 manufacturing process, after the formation of the source electrode layer 20s, additional treatment and/or process, such as chemical doping can be done to the source electrode layer 20s, so that the electrical conductivity of the source electrode layer 20s can be increased dramatically. After the bank layer 24 is formed, another treatment and/or process, such as chemical treatment, heat treatment and/or UV irradiation can be done to the exposed region of the source electrode layer 20s to reverse the effect of the prior treatment so that the source electrode layer 20s can recover the initial intrinsic resistivity and electronic characterization, while the bank layer 24 serves as a mask to maintain the increased electrical conductivity of the source electrode layer 20s that is under its coverage.

The more there are pixels having the source electrode layers 20s coupled together as in the fourth embodiment, the more the voltage in the source electrode layers 20s of respective vertical organic light emitting transistors 20 is made uniform over the entire display 1, so that the display 1 hardly showing visible display defects and demonstrating better display quality is realized.

Although the source electrode layer 20s is described as being continuous between respective vertical organic light emitting transistors 20 so that no current supply lines 12 are provided in the fourth embodiment, it is also possible to form current supply lines 12 along with the configuration of the fourth embodiment.

Fifth Embodiment

The configuration of a fifth embodiment of the display 1 of the present invention will be described, mainly centering on the points different from the first to fourth embodiments.

The fourth embodiment wherein current supply lines 12 are provided can be combined with any of the configurations of the first to third embodiments, and with such combined use of measures, the voltage difference in each current supply line 12 can be reduced even more as compared to that of the fourth embodiment. This ensures that local voltage drops rarely occur in each current supply line 12, and allows for realization of the display 1 with better display quality.

Other Embodiments

Below, other embodiments will be described.

<1> The display 1 may be configured to display images by emitting light output from the organic EL layer 20c to the opposite side from the substrate 30. Such a configuration is referred to as "top emission type" and advantageous in that it allows devices and wirings to be configured also between the vertical organic light emitting transistor 20 and the substrate 30.

<2> The configurations and control methods of the display 1 described above are merely examples and the present invention is not limited to the various illustrated configurations.

The invention claimed is:

1. A plurality of vertical organic light emitting transistors arranged in arrays along a first direction and a second direction orthogonal to the first direction;
   a data line supplying a voltage for controlling gate electrodes of the plurality of vertical organic light emitting transistors;
   thin-film transistors each connected between a gate electrode of each of the vertical organic light emitting transistors and the data line and controlling voltage supply to the gate electrodes of the vertical organic light emitting transistors;
   a gate line connected to gate electrodes of the thin-film transistors and transmitting a signal that controls the thin-film transistors;
   a plurality of current supply lines extending along the first direction and supplying a current to each of a group of vertical organic light emitting transistors aligned along the first direction; and
   at least one auxiliary line extending along the second direction and connecting at least two of the plurality of current supply lines;
   wherein the at least one auxiliary line includes a wiring line made of a material that makes up the gate line and formed in a layer in which the gate line is provided.

2. The display according to claim 1, wherein the at least one auxiliary line is formed closer to a substrate than a source electrode of the vertical organic light emitting transistor.

3. The display according to claim 1, wherein the at least one auxiliary line includes a wiring line made of a material that makes up the gate electrode of the vertical organic light emitting transistor and configured in a layer in which the gate electrode of the vertical organic light emitting transistor is provided.

4. A plurality of vertical organic light emitting transistors arranged in arrays along a first direction and a second direction orthogonal to the first direction;
   a data line supplying a voltage for controlling gate electrodes of the plurality of vertical organic light emitting transistors;
   thin-film transistors each connected between a gate electrode of each of the vertical organic light emitting transistors and the data line and controlling voltage supply to the gate electrodes of the vertical organic light emitting transistors;
   a gate line connected to gate electrodes of the thin-film transistors and transmitting a signal that controls the thin-film transistors;
   a plurality of current supply lines extending along the first direction and supplying a current to each of a group of vertical organic light emitting transistors aligned along the first direction; and
   at least one auxiliary line extending along the second direction and connecting at least two of the plurality of current supply lines;
   wherein the at least one auxiliary line includes a wiring line made of a material that makes up the gate electrode of the vertical organic light emitting transistor and configured in a layer in which the gate electrode of the vertical organic light emitting transistor is provided.

5. The display according to claim 4, wherein the at least one auxiliary line is formed closer to a substrate than a source electrode of the vertical organic light emitting transistor.

6. A display comprising:
   a plurality of vertical organic light emitting transistors arranged in arrays along a first direction and a second direction orthogonal to the first direction;
   a data line supplying a voltage for controlling gate electrodes of the plurality of vertical organic light emitting transistors;
   thin-film transistors each connected between the gate electrode of each of the vertical organic light emitting transistors and the data line and controlling voltage supply to the gate electrodes of the vertical organic light emitting transistors; and
   a gate line connected to the gate electrodes of the thin-film transistors and transmitting a signal that controls the thin-film transistors,
   at least two of the plurality of vertical organic light emitting transistors adjacent each other having a source electrode layer continuously formed therebetween.

7. The display according to claim 6, further comprising a plurality of current supply lines extending along the first direction and supplying a current to each of a group of vertical organic light emitting transistors aligned along the first direction.

8. The display according to claim 7, further comprising at least one auxiliary line extending along the second direction and connecting at least two of the plurality of current supply lines.

9. The display according to claim 8, wherein the at least one auxiliary line is formed closer to a substrate than a source electrode of the vertical organic light emitting transistor.

10. The display according to claim 9, wherein the at least one auxiliary line includes a wiring line made of a material that makes up the gate line and formed in a layer in which the gate line is provided.

11. The display according to claim 10, wherein the at least one auxiliary line includes a wiring line made of a material that makes up the gate electrode of the vertical organic light emitting transistor and configured in a layer in which the gate electrode of the vertical organic light emitting transistor is provided.

12. The display according to claim 9, wherein the at least one auxiliary line includes a wiring line made of a material that makes up the gate electrode of the vertical organic light emitting transistor and configured in a layer in which the gate electrode of the vertical organic light emitting transistor is provided.

13. The display according to claim 8, wherein the at least one auxiliary line includes a wiring line made of a material that makes up the gate line and formed in a layer in which the gate line is provided.

14. The display according to claim 8, wherein the at least one auxiliary line includes a wiring line made of a material that makes up the gate electrode of the vertical organic light emitting transistor and configured in a layer in which the gate electrode of the vertical organic light emitting transistor is provided.

\* \* \* \* \*